United States Patent
Wilson et al.

(10) Patent No.: US 7,033,891 B2
(45) Date of Patent: Apr. 25, 2006

(54) TRENCH GATE LATERALLY DIFFUSED MOSFET DEVICES AND METHODS FOR MAKING SUCH DEVICES

(75) Inventors: Peter H. Wilson, Boulder Creek, CA (US); Steven Sapp, Felton, CA (US); Neill Thornton, Turlock, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 79 days.

(21) Appl. No.: 10/269,126

(22) Filed: Oct. 3, 2002

(65) Prior Publication Data

US 2004/0065919 A1    Apr. 8, 2004

(51) Int. Cl.
| | |
|---|---|
| H01L 21/336 | (2006.01) |
| H01L 21/8238 | (2006.01) |
| H01L 29/76 | (2006.01) |
| H01L 29/94 | (2006.01) |
| H01L 31/062 | (2006.01) |

(52) U.S. Cl. .................. 438/270; 438/272; 438/259; 438/212; 257/329; 257/330; 257/331; 257/343

(58) Field of Classification Search ................ 257/343, 257/329, 330, 331; 438/270, 271, 272, 259, 438/212
See application file for complete search history.

(56) References Cited

U.S. PATENT DOCUMENTS

| | | | |
|---|---|---|---|
| 3,404,295 A | 10/1968 | Warner et al. | |
| 3,412,297 A | 11/1968 | Amlinger | |
| 3,497,777 A | 2/1970 | Teszner et al. | |
| 3,564,356 A | 2/1971 | Wilson | |
| 4,003,072 A | 1/1977 | Matsushita et al. | |
| 4,300,150 A | 11/1981 | Colak | |
| 4,326,332 A | 4/1982 | Kenney et al. | |
| 4,337,474 A | 6/1982 | Yukimoto | |
| 4,579,621 A | 4/1986 | Hine | |
| 4,638,344 A | 1/1987 | Cardwell, Jr. | |
| 4,639,761 A | 1/1987 | Singer et al. | |
| 4,698,653 A | 10/1987 | Cardwell, Jr. | |

(Continued)

FOREIGN PATENT DOCUMENTS

| | | |
|---|---|---|
| DE | 4300806 C1 | 12/1993 |
| DE | 19736981 A1 | 8/1998 |

(Continued)

OTHER PUBLICATIONS

Park et al., "Lateral Trench Gate Super-Junction SOI-LDMOSFETs with Low On-Resistance", Institute for Microelectronics, University of Technology Vienna, Austria (date unknown).

(Continued)

*Primary Examiner*—Steven Loke
(74) *Attorney, Agent, or Firm*—Townsend and Townsend and Crew LLP (57) ABSTRACT

A MOSFET device for RF applications that uses a trench gate in place of the lateral gate used in lateral MOSFET devices is described. The trench gate in the devices of the invention is provided with a single, short channel for high frequency gain. The device of the invention is also provided with an asymmetric oxide in the trench gate, as well as LDD regions that lower the gate-drain capacitance for improved RF performance. Such features allow these devices to maintain the advantages of the LDMOS structure (better linearity), thereby increasing the RF power gain. The trench gate LDMOS of the invention also reduces the hot carrier effects when compared to regular LDMOS devices by reducing the peak electric field and impact ionization. Thus, the devices of the invention will have a better breakdown capability.

39 Claims, 6 Drawing Sheets

U.S. PATENT DOCUMENTS

| | | |
|---|---|---|
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,071,782 A | 12/1991 | Mori |
| 5,072,266 A | 12/1991 | Bulucea |
| 5,079,608 A | 1/1992 | Wodarczyk et al. |
| 5,105,243 A | 4/1992 | Nakagawa et al. |
| 5,142,640 A | 8/1992 | Iwamatsu |
| 5,164,325 A | 11/1992 | Cogan et al. |
| 5,164,802 A | 11/1992 | Jones et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike, Jr. et al. |
| 5,268,311 A | 12/1993 | Euen et al. |
| 5,275,965 A | 1/1994 | Manning |
| 5,294,824 A | 3/1994 | Okada |
| 5,298,761 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,519,245 A | 5/1996 | Tokura et al. |
| 5,541,425 A | 7/1996 | Nishihara |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,952 A | 4/1999 | Darwish et al. |
| 5,897,360 A | 4/1999 | Kawaguchi |
| 5,900,663 A | 5/1999 | Johnson et al. |
| 5,906,680 A | 5/1999 | Meyerson |
| 5,917,216 A | 6/1999 | Floyd et al. |
| 5,929,481 A | 7/1999 | Hsieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,156,606 A | 12/2000 | Michaelis |
| 6,156,611 A | 12/2000 | Lan et al. |
| 6,163,052 A | 12/2000 | Liu et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,773 B1 | 1/2001 | Fujishima |
| 6,174,785 B1 | 1/2001 | Parekh et al. |
| 6,184,545 B1 | 2/2001 | Werner et al. |

| | | |
|---|---|---|
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,233 B1 | 4/2001 | D'Anna |
| 6,225,649 B1 | 5/2001 | Minato |
| 6,228,727 B1 | 5/2001 | Lim et al. |
| 6,239,464 B1 | 5/2001 | Tsuchitani et al. |
| 6,265,269 B1 | 7/2001 | Chen et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,905 B1 | 8/2001 | Mo |
| 6,277,706 B1 | 8/2001 | Ishikawa |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,313,482 B1 | 11/2001 | Baliga |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B1 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B1 | 5/2002 | Deboy et al. |
| 6,400,003 B1 | 6/2002 | Huang |
| 6,433,385 B1 | 8/2002 | Kocon et al. |
| 6,436,779 B1 | 8/2002 | Hurkx et al. |
| 6,437,399 B1 | 8/2002 | Huang |
| 6,441,454 B1 | 8/2002 | Hijzen et al. |
| 6,452,230 B1 | 9/2002 | Boden, Jr. |
| 6,465,304 B1 | 10/2002 | Blanchard et al. |
| 6,465,843 B1 | 10/2002 | Hirler et al. |
| 6,465,869 B1 | 10/2002 | Ahlers et al. |
| 6,472,678 B1 | 10/2002 | Hshieh et al. |
| 6,472,708 B1 | 10/2002 | Hshieh et al. |
| 6,475,884 B1 | 11/2002 | Hshieh et al. |
| 6,476,443 B1 | 11/2002 | Kinzer |
| 6,479,352 B1 | 11/2002 | Blanchard |
| 6,501,146 B1 | 12/2002 | Harada |
| 2001/0023961 A1 | 9/2001 | Hsieh et al. |
| 2001/0028083 A1 | 10/2001 | Onishi et al. |
| 2001/0032998 A1 | 10/2001 | Iwamoto et al. |
| 2001/0041400 A1 | 11/2001 | Ren et al. |
| 2001/0049167 A1 | 12/2001 | Madson |
| 2001/0050394 A1 | 12/2001 | Onishi et al. |
| 2002/0009832 A1 | 1/2002 | Blanchard |
| 2002/0014658 A1 | 2/2002 | Blanchard |
| 2002/0066924 A1 | 6/2002 | Blanchard |
| 2002/0070418 A1 | 6/2002 | Kinzer et al. |

FOREIGN PATENT DOCUMENTS

| | | |
|---|---|---|
| EP | 0975024 A2 | 1/2000 |
| EP | 1026749 A1 | 8/2000 |
| EP | 1054451 A2 | 11/2000 |
| EP | 0747967 B1 | 2/2002 |
| EP | 1205980 A1 | 5/2002 |
| JP | 62-069562 | 3/1987 |
| JP | 63-186475 | 8/1988 |
| JP | 63-288047 | 11/1988 |
| JP | 64-022051 | 1/1989 |
| JP | 01-192174 | 8/1989 |
| JP | 05226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 11/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/047171 A1 | 6/2002 |

OTHER PUBLICATIONS

U.S. Appl. No. 08/742,754, filed Oct. 1, 1996.
U.S. Appl. No. 09/405,210, filed Sep. 24, 1999.
U.S. Appl. No. 09/780,040, filed Feb. 9, 2001.
U.S. Appl. No. 10/120,207, filed Apr. 15, 2002.
U.S. Appl. No. 09/428,616, filed Oct. 27, 1999.
Baliga "New Concepts in Power Rectifiers," Physics of Semiconductor Devices, Proceedings of the Third Int'l Workshop, Madras (India), Committee on Science and Technology in Developing Countries(1985).
Baliga "Options for CVD of Dielectrics Include Low-k Materials," Technical Literature from Semiconductor International Jun. 1998.
Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.
Bulucea "Trench DMOS Transistor Technology For High Current (100 A Range) Switching" Solid-State Electronics vol. 34 No. pp. 493-507 (1991).
Chang et al. "Numerical and experimental Analysis of 500-V Power DMOSFET with an Atomic-Lattice Layout," IEEE Transactions on Electron Devices 36:2623 (1989).
Chang et al. "Self-Aligned UMOSFET's with a Specific On-Resistance of 1mQ cm$^2$," IEEE Transactions on Electron Devices 34:2329-2333 (1987).
Curtis, et al. "APCVD TEOS: 03 Advanced Trench Isolation Applications," Semiconductor Fabtech 9th Edition (1999).

Darwish et al. A New Power W-Gated Trench MOSFET (WMOSFET) with High Switching Performance. ISPSD Proceedings—Apr. 2003, Cambridge.

Fujihira "Theory of Semiconductor Superjunction Devices" Jpn. J. Appl. Phys. vol. 36 pp. 6254-6252 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001).

Glenn et al. "A Novel Vertical Deep Trench RESURF DMOS (VTR-DMOS)" IEEE ISPD 2000, May 22-25, Toulouse France.

Kao et al. "Two Dimensional Thermal Oxidation of Silicon-I. Experiments,", *IEEE Transactions on Electron Devices*, vol. ED-34,No. 5, May 1987.

Kao et al. "Two Dimensional Thermal Oxidation of Silicon-II. Modeling Stress Effects in Wet Oxides,", *IEEE Transactions on Electron Devices*, vol. ED-35, No. 1, Jan. 1988.

Lorenz et al. "COOL MOS-An important milestone towards a new power MOSFET generation" Power Conversion pp. 151-160 (1988).

Moghadam "Delivering Value Around New Industry Paradigms," Technical Literature from Applied Materials, pp. 1-11, vol. 1, Issue 2, Nov. 1999.

Shenoy et al."Analysis of the Effect of Charge Imbalance on the Static and Dynamic Charateristics of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf "Silicon Processing for The VLSI Era" vol. 2 Process Integration Lattice Press (1990).

"CoolMOS™ the second generation," Infineon Technologies product information (2000).

"IR develops CoolMOS™-equivalent technology, positions it at the top of a 3-tiered line of new products for SMPS," International Rectifiers company information available at http://www.irf.com (1999).

Technical Literature from Quester Technology, Model APT-4300 300mm Atmospheric TEOS/Ozone CVD System (unknown date).

Technical Literature from Quester Technology, Model APT-6000 Atmospheric TEOS-Ozone CVD System (unknown date).

Technical Literature from Silicon Valley Group Thermal Systems, APNext, High Throughput APCVD Cluster Tool for 200 mm/300 mm Wafer Processing (unknown date).

TRENCH GATE LATERALLY DIFFUSED MOSFET DEVICES AND METHODS FOR MAKING SUCH DEVICES

FIELD OF THE INVENTION

The invention generally relates to methods for fabricating integrated circuits (ICs) and semiconductor devices and the resulting structures. More particularly, the invention relates to metal oxide semiconductor field effect transistor (MOSFET) devices and methods for making such devices. Even more particularly, the invention relates to trench gate laterally-diffused MOSFET devices and methods for making such devices.

BACKGROUND OF THE INVENTION

In IC fabrication, devices such as transistors may be formed on a semiconductor wafer or substrate, which is typically made of silicon. MOSFET devices are widely used in numerous electronic apparatus, including automotive electronics, disk drives and power supplies. Generally, these apparatus function as switches and are used to connect a power supply to a load.

Figure 1:
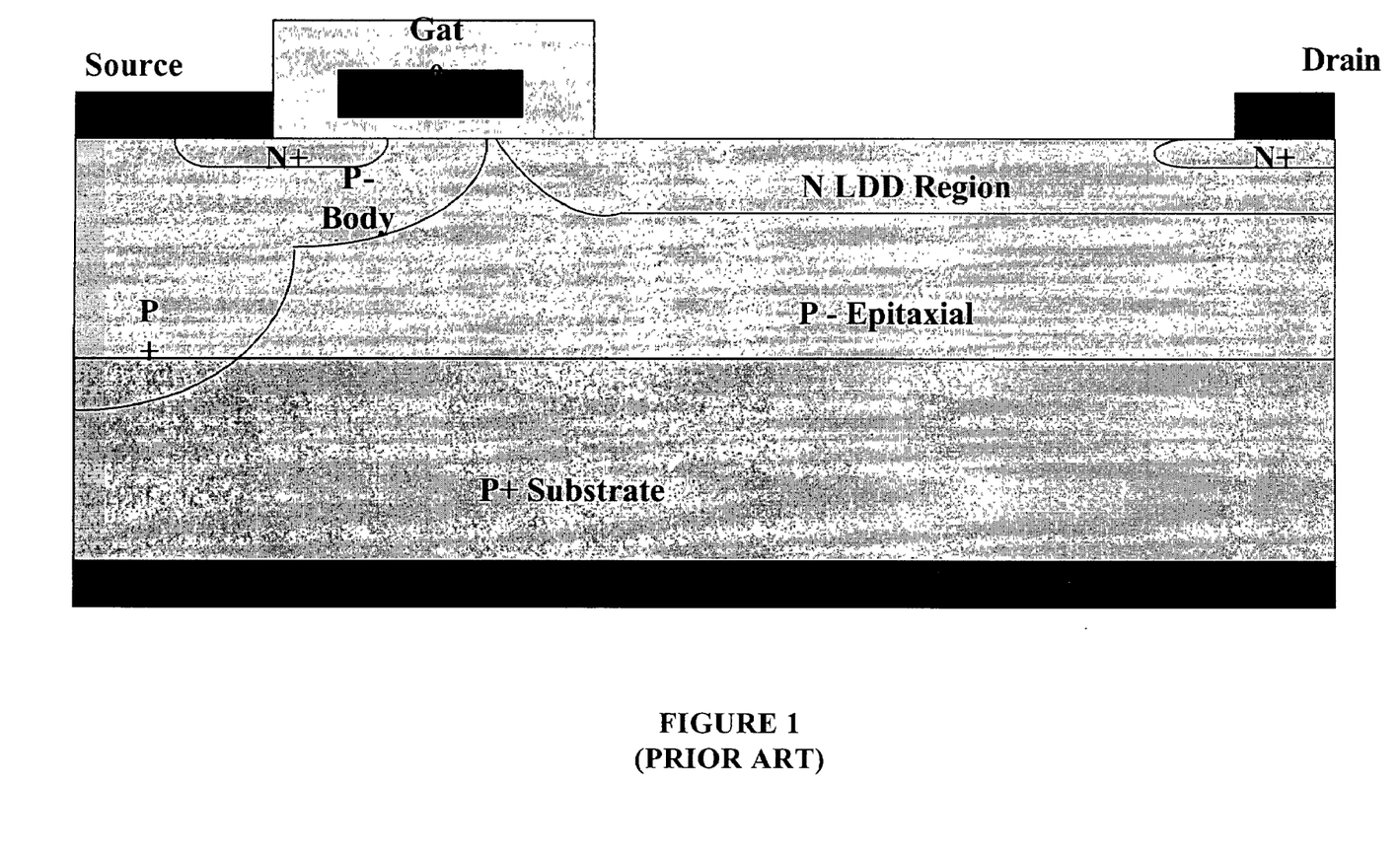
FIG. 1 illustrates a prior art MOSFET device.

One of the applications in which MOSFET devices have been used is for radio frequency (RF) applications. Such "RF" MOSFET devices generally utilize standard lateral transistors. See, for example, the lateral MOSFET device described in U.S. Pat. No. 5,949,104, as well as the device illustrate in FIG. 1. Such lateral MOSFET devices often have a diffused source that allows a backside contact for improved thermal and parasitic reductions.

Recent advances in lateral (or laterally-diffused) MOSFET (LDMOS) devices have improved the performance and cost characteristics of lateral MOSFET devices when compared to vertical MOSFET devices for RF power amplifiers in base stations applications. Such RF LDMOS devices have been particularly useful for wireless base station applications. The RF vertical (or vertically-diffused) VDMOS structure unfortunately suffers from certain limitations relative to the LDMOS such as high output capacitance (which decreases efficiency), decreased power gain, narrowing of the usable bandwidth, and source inductance that decreases the operating efficiency.

It has been proposed to use a trench gate in place of the lateral gate so often used in RF MOSFET devices. See, for example, U.S. Pat. No. 6,400,003. The proposed structure in that patent, unfortunately suffers from several setbacks. First, the trench gate has a dual diffused channel on both sides of the trench gate. Second, the drain region extends entirely around the body portion.

SUMMARY OF THE INVENTION

The invention provides a MOSFET device for RF applications that uses a trench gate in place of the lateral gate used in lateral MOSFET devices. The trench gate in the devices of the invention is provided with a single, short channel for high frequency gain. The device of the invention is also provided with an asymmetric oxide in the trench gate, as well as LDD regions that lower the gate-drain capacitance for improved RF performance. Such features allow these devices to maintain the advantages of the LDMOS structure (better linearity), thereby increasing the RF power gain. The trench gate LDMOS of the invention also reduces the hot carrier effects when compared to regular LDMOS devices by reducing the peak electric field and impact ionization. Thus, the devices of the invention will have a better breakdown capability.

The invention includes a MOSFET device comprising a trench gate structure containing an asymmetric insulating layer and a plurality of drift drain regions with a first drift region extending under the gate structure. The invention also includes a semiconductor device and an electronic apparatus containing such a MOSFET device. The invention further includes a RF MOSFET device comprising a trench gate structure containing a single channel and an asymmetric oxide layer and a plurality of drift drain regions with a first drift region extending under the gate structure. The invention still further includes a MOSFET device, comprising a trench gate structure containing an asymmetric insulating layer and a plurality of drift drain regions with a first drift region extending under the gate structure.

The inventions also includes a method for making a MOSFET device by providing a trench gate structure containing an asymmetric insulating layer and providing a plurality of drift drain regions with a first drift region extending under the gate structure. The invention further includes a method for making a making a MOSFET device by providing a substrate, providing a trench in the substrate, filling the trench with an insulating layer, providing a second trench in the insulating layer such that the second trench is not symmetric relative to the first trench, filling the second trench with a conductive material, and providing a plurality of dopant regions adjacent the trench with a first dopant region extending under the trench. The invention still further includes a method for making a making a MOSFET device by providing a substrate having an epitaxial upper surface, providing a trench in the upper surface, filling the trench with an oxide layer, providing a second trench in the oxide layer so that the second trench is not symmetric relative to the first trench, filling the second trench with a conductive material, and providing a plurality of dopant regions adjacent the trench and within the epitaxial layer, wherein the plurality of dopant regions contains a first dopant region extending under the trench and a second dopant region with a dopant concentration higher than the first dopant region. The invention also includes MOSFET devices made by such methods.

BRIEF DESCRIPTION OF THE DRAWINGS

FIGS. 1–6 are views of one aspect of the MOSFET devices and methods of making the MOSFET devices according to the invention, in which:

FIG. 2 illustrates a MOSFET device in one aspect of the invention;

FIGS. 1–6 presented in conjunction with this description are views of only particular—rather than complete—portions of the MOSFET devices and methods of making the MOSFET devices according to the invention. Together with the following description, the Figures demonstrate and explain the principles of the invention.

DETAILED DESCRIPTION OF THE INVENTION

The following description provides specific details in order to provide a thorough understanding of the invention. The skilled artisan, however, would understand that the invention can be practiced without employing these specific details. Indeed, the invention can be practiced by modifying the illustrated system and method and can be used in conjunction with apparatus and techniques conventionally used in the industry. For example, the MOSFET devices are described for RF applications, but could be used in non-RF applications such as switching.

As noted above, the invention generally comprises a structure that combines the benefits of the LDMOS structure (i.e., a low gate-to-drain capacitance and a good linearity) with the benefits of a short gate channel. Thus, any structure that combines theses feature can be employed in the invention. In one aspect of the invention, these benefits are combined by using a trench gate laterally-diffused MOSFET device as described below. By using this structure, the breakdown capabilities of conventional LDMOS structure can be improved. In addition, the carrier effects (i.e., injection) will be improved, and the peak electric field and impact ionization of the drain region will be reduced.

Figure 2:
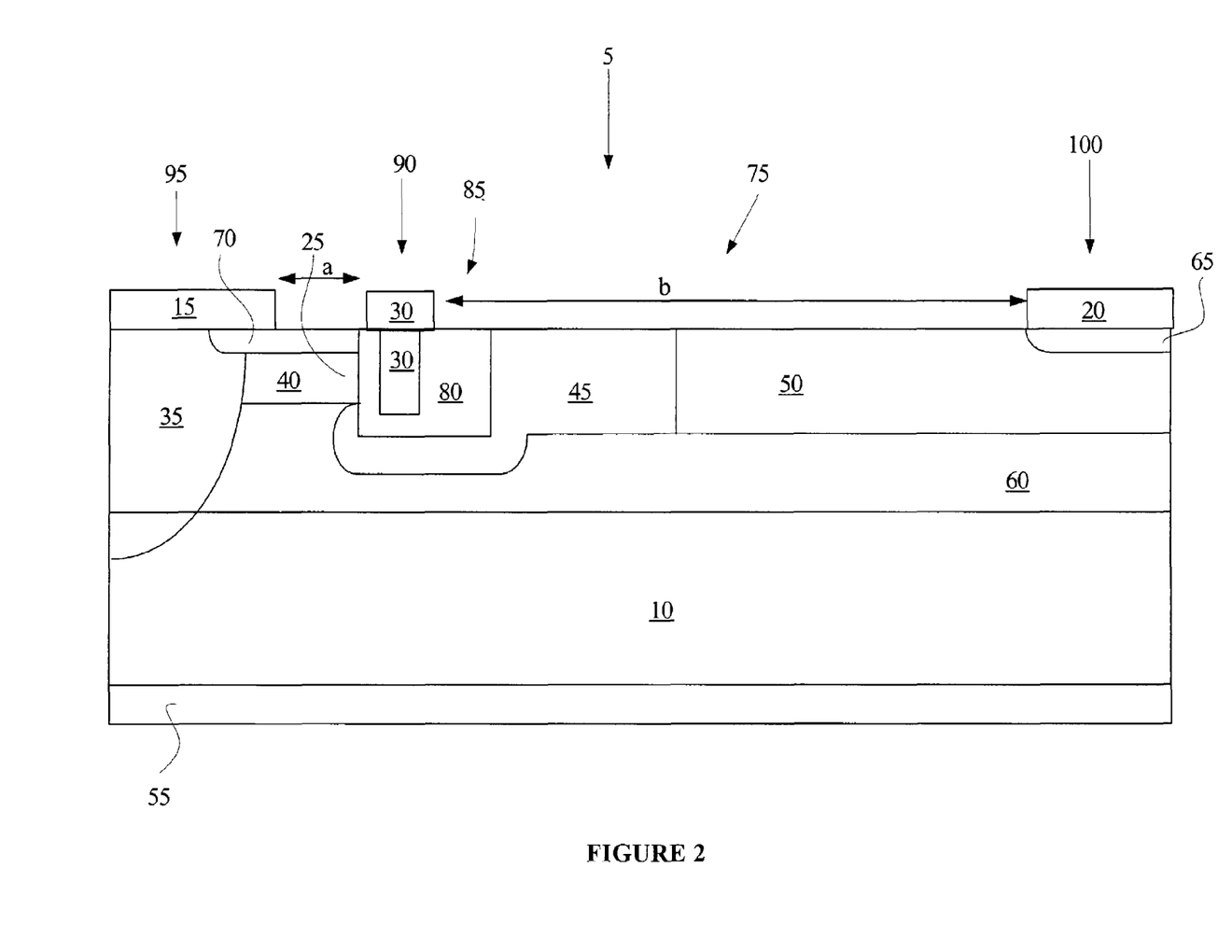

To achieve these benefits, the structure illustrated in the FIG. 2 is used in the invention. In FIG. 2, the MOSFET device 5 comprises a semiconductor substrate 10, typically of monocrystalline silicon (Si), with an epitaxial layer 60 formed thereon. In one aspect of the invention, the silicon substrate 10 can have a first conductivity type, such as B (boron), with a dopant concentration of about $2 \times 10^{19}$ atoms/cm$^3$. In another aspect of the invention, the substrate can have a resistivity ranging from 0.005 to 0.01 ohm centimeter. A contact region 55 can be located on the "backside" of the substrate 10. In one aspect of the invention, the contact region 55 is a metal contact. In one aspect of the invention, the depth of the epitaxial layer 60 can range from about 3 to about 9 microns and can have a first conductivity dopant concentration of about $1.2 \times 10^{15}$ atoms/cm$^3$. In another aspect of the invention, the epitaxial layer can have a resistivity ranging from about 20 to about 30 ohm centimeters.

A gate structure 90 is located between source region 95 and drain region 100. The gate structure 90 is separated from the source region 95 by a body region 40. And the gate structure 90 is separated from the drain region 100 by a lightly doped drain (LDD) region 75.

The gate structure 90 contains gate conductor 30, as well as an insulating layer 80 surrounding that part of the gate conductor 30 in the trench 85. The MOSFET device contains channel region 25 of a first conductivity type (p-type in one aspect of the invention) that is adjacent to the side of the insulating layer 80 of the gate structure 90 nearest the source region 95. Because of this configuration of the gate in the trench 85, the gate structure 90 is often referred to as a trench gate in which length of the gate is controlled by the depth of the trench 85. In one aspect of the invention, the trench depth can range from about 0.5 to about 4.0 microns. In another aspect of the invention, the depth of the trench can be about 1 to about 2 microns. In yet another aspect of the invention, the trench depth can be about 1.5 microns.

With this configuration of the gate structure 90, the thin insulating layer between the channel region 25 and the conducting layer 30 operates as a high-quality gate insulating layer. In addition, the insulating layer 80 (which in one aspect of the invention is asymmetric) can also reduce the gate to drain capacitance ($C_{gd}$). As well, the thick bottom oxide (with a thickness of about 1 kÅ to about 4 kÅ) can reduce the gate-to-drain overlap capacitance and thereby lower the gate charge.

By applying a positive gate voltage to device 5, the channel region 25 can change the polarity from a first conductivity type to a second conductivity type. This polarity change—called inversion—permits the carriers to drift (e.g., flow) from the dopant region 70 to the lightly doped drain (LDD) region 75. Thus, the channel region 25 can be modulated by a positive gate voltage.

Source region 95 comprises dopant region 35 and source electrode 15. The dopant region 35 is typically of a first conductivity type with a concentration ranging from about $5 \times 10^{15}$ to about $1 \times 10^{19}$ atoms/cm$^3$. In one aspect of the invention, the concentration of dopant region 35 is about $1 \times 10^{19}$ atoms/cm$^3$. The source electrode 15 is located over dopant region 35 and overlaps body region 40. The body region 40 is typically of a first conductivity type with a concentration greater than or equal to the concentration of the epitaxial layer 60. In one aspect of the invention, the concentration of body region 40 is about $2.5 \times 10^{15}$ atoms/cm$^3$.

As known in the art, source electrode 15 can be separated from the body region 40 by dopant region 70 of a second conductivity type. As well, the source electrode 15 can be separated from the gate structure 90 by a distance (a) that depends on the desired characteristics of the gate. Generally, this distance (a) can range from about 0.5 to about 1.5 microns.

The drain region 100 contains a drain electrode 20 overlying a portion of LDD region 75. In one aspect of the invention, the drain electrode 20 is separated from the gate by a distance (b) depending on the desired drain-source breakdown voltage. In one aspect of the invention, this distance typically can be between about 3 to about 5 microns. In another aspect of the invention, the drain electrode is separated from gate by a distance of about 4 microns. The drain electrode 20 is also separated from the LDD region 75 by a dopant region 65. In one aspect of the invention, the dopant region 65 is of a second conductivity type with a concentration of ranging from about $1 \times 10^{15}$ to $1 \times 10^{16}$ atoms/cm$^3$.

The LDD region 75 contains a first drain drift region 45 of the MOS structure. The first drain drift region 45 is formed completely within the epitaxial layer 60, with a part underlying the trench 85. In one aspect of the invention, the first enhanced drain drift region 45 has second conductivity type when the epitaxial layer 60 has a first conductivity type. In one aspect of the invention, the first enhanced drain drift region 45 can have a dopant concentration ranging from about $1 \times 10^{11}$ to about $5 \times 10^{13}$ atoms/cm$^3$. In another aspect of the invention, this dopant concentration is about $2 \times 10^{12}$ atoms/cm$^3$. The first enhanced drain region 45 can have lateral dimensions ranging from about 0.5 to about 5.0 microns and vertical dimensions ranging from about 0.2 to about 0.5 microns The LDD region 75 also contains a second enhanced drain drift region 50 that is adjacent to and contacting the first drain drift region 45. The second drain drift region 50 is also formed completely within the epitaxial layer 60. In one aspect of the invention, the second drain drift region 50 has second conductivity type when the epitaxial layer 60 has a first conductivity type. In one aspect of the invention, the second drain drift region can have a dopant concentration greater than the first drain drift region 45. In one aspect of the invention, the dopant concentration can range from about $1\times10^{11}$ to about $1\times10^{14}$ atoms/cm$^3$. In another aspect of the invention, this dopant concentration is about $1\times10^3$ atoms/cm$^3$. The second drain region 50 can have lateral dimensions ranging from more than 0 to about 5 microns and vertical dimensions substantially similar to the first drain drift region 45.

Using the two drain drift regions 45 and 50 in LDD region 75 allows one to increase the maximum drain drift current density of the device, as well as increase the drain-to-source breakdown voltage. Indeed, the effective electrical field in the LDD region 75 is strong enough to cause the avalanche effect of carrier multiplication at certain critical concentration of carriers. Thus, the critical carrier concentration can be related to the breakdown voltage in device 5. In one aspect of the invention, three or more drift regions that are uniformly graded from a light dopant concentration to a heavier dopant concentration can be used as LDD region 75.

In one aspect of the invention, the second drain drift region 50 has a concentration higher than the concentration of the first drain drift region 45. This configuration can result in the redistribution of the critical electrical fields in the channel region 25 and can result in an increase of the drain-to-source breakdown voltage. The maximum current density in the source-drain channel of the device can also be increased when the total concentration in the drain drift region is increased.

Using the two drain drift regions 45 and 50 also allows the LDD region 75 to act as a non-linear resistor, especially when the applied voltage is varied. This non-linear behavior suggests the existence of a pinch-off point in the LDD region 75. In other words, as the applied voltage is increase, the depletion region present in the LDD region 75 can expand and lead to a pinch-off point.

Configuring the LDD region 75 as indicated above can also be used to support efficient operation of device 5. The dopant profile of the LDD region 75 can be controlled by having different sectors each with a different dopant concentration. The different doping concentrations can be configured to ensure that any breakdown does not occur near the upper surface of the device, but deeper within the LDD region 75 near the interface of the dopant region 65 and LDD region 75. The ability to configure the LDD region 75 in this manner must be carefully balanced, of course, with the other operating parameters of the device such as $C_{gd}$ and the drain to source capacitance ($C_{ds}$).

As noted above, the drift drain region 45 extends under the trench 85. In one aspect of the invention, the dopant concentration of the region under the trench 85 should be higher than the concentration of the remainder of LDD region 75. This region is an extension of LDD region 75 and helps create a current flow from the drain to the source. The concentration of this region should be tailored to the required drain-source breakdown voltage, as well as to not to substantially increase the gate to drain capacitance.

By using a trench gate, the devices of the invention are able to achieve several improvements over existing LDMOS devices. First, the devices of the invention have an improved RF power gain and efficiency due to the reduction of the $C_{gd}$ resulting from the asymmetric insulating material in the trench and the shorter channel. Second, the devices of the invention are able to reduce the hot carrier effects by reducing the peak electric field. Third, the operating voltages of the devices of the invention can be increased above the capabilities of existing LDMOS devices.

Figure 4:
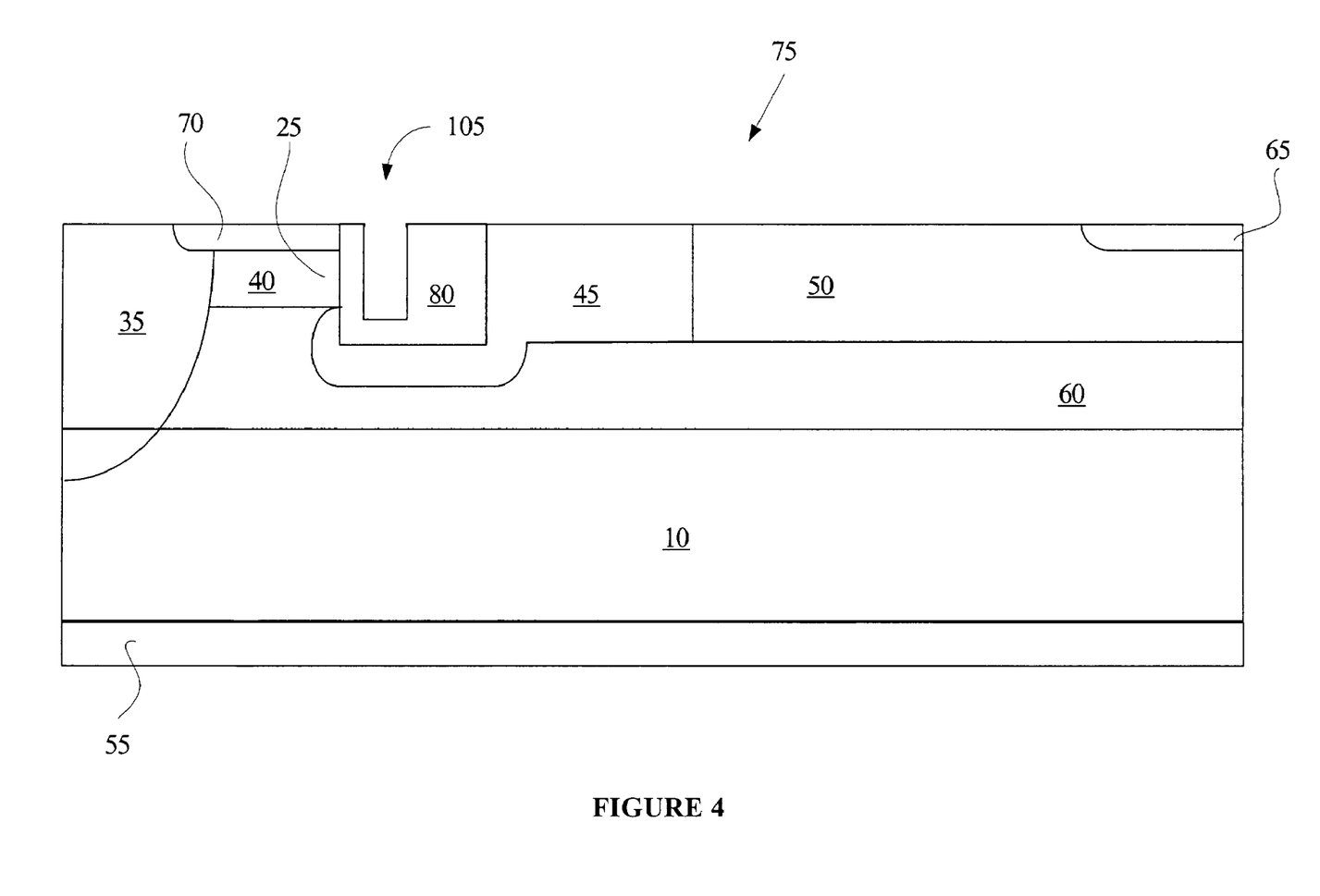
Figure 5:
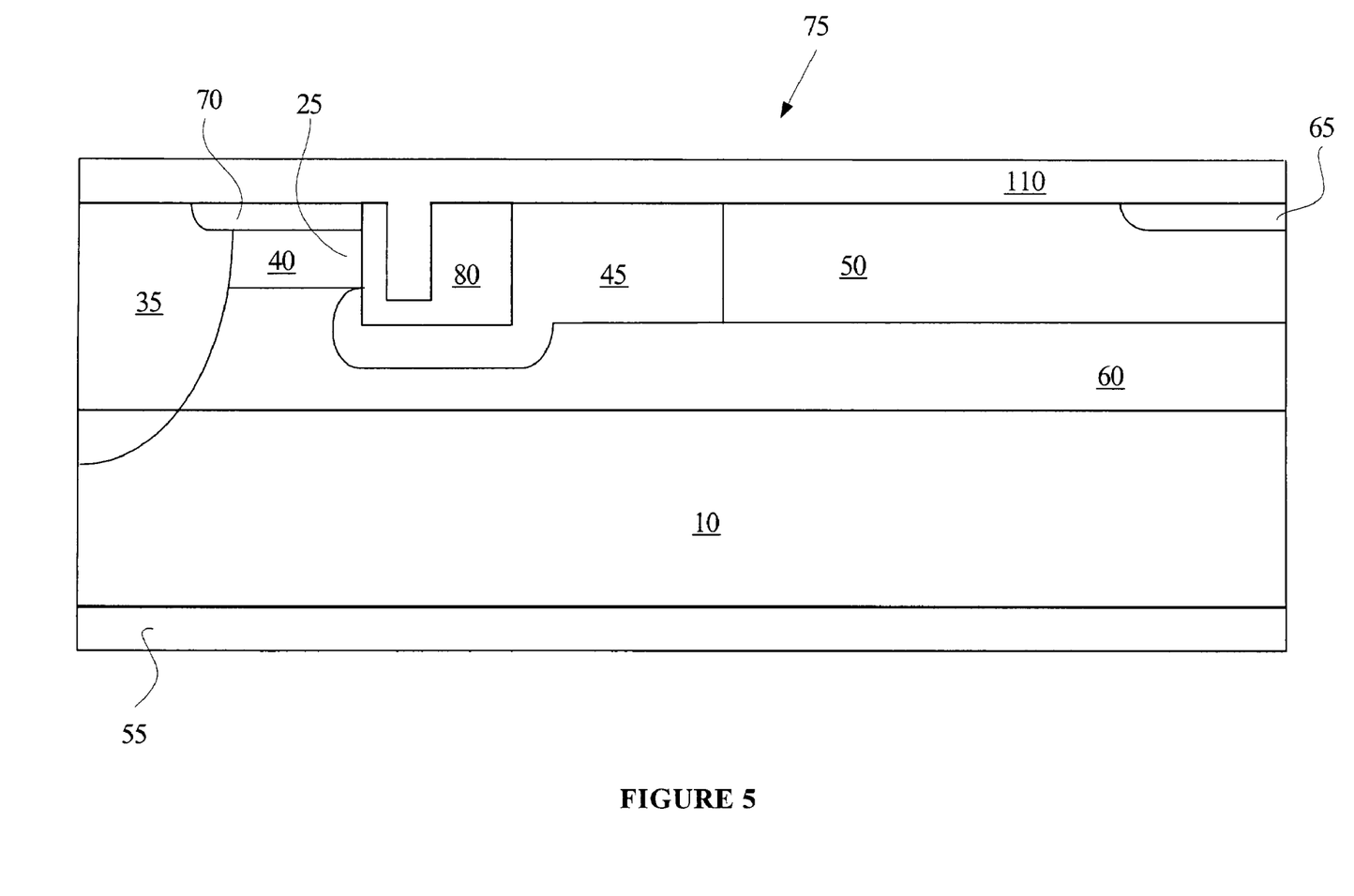

The device illustrated in FIG. 2 can be made by any process resulting in the depicted structure. In one aspect of the invention, the process described below and illustrated in FIGS. 3–5 is used to make the structure depicted in FIG. 2.

Figure 3:
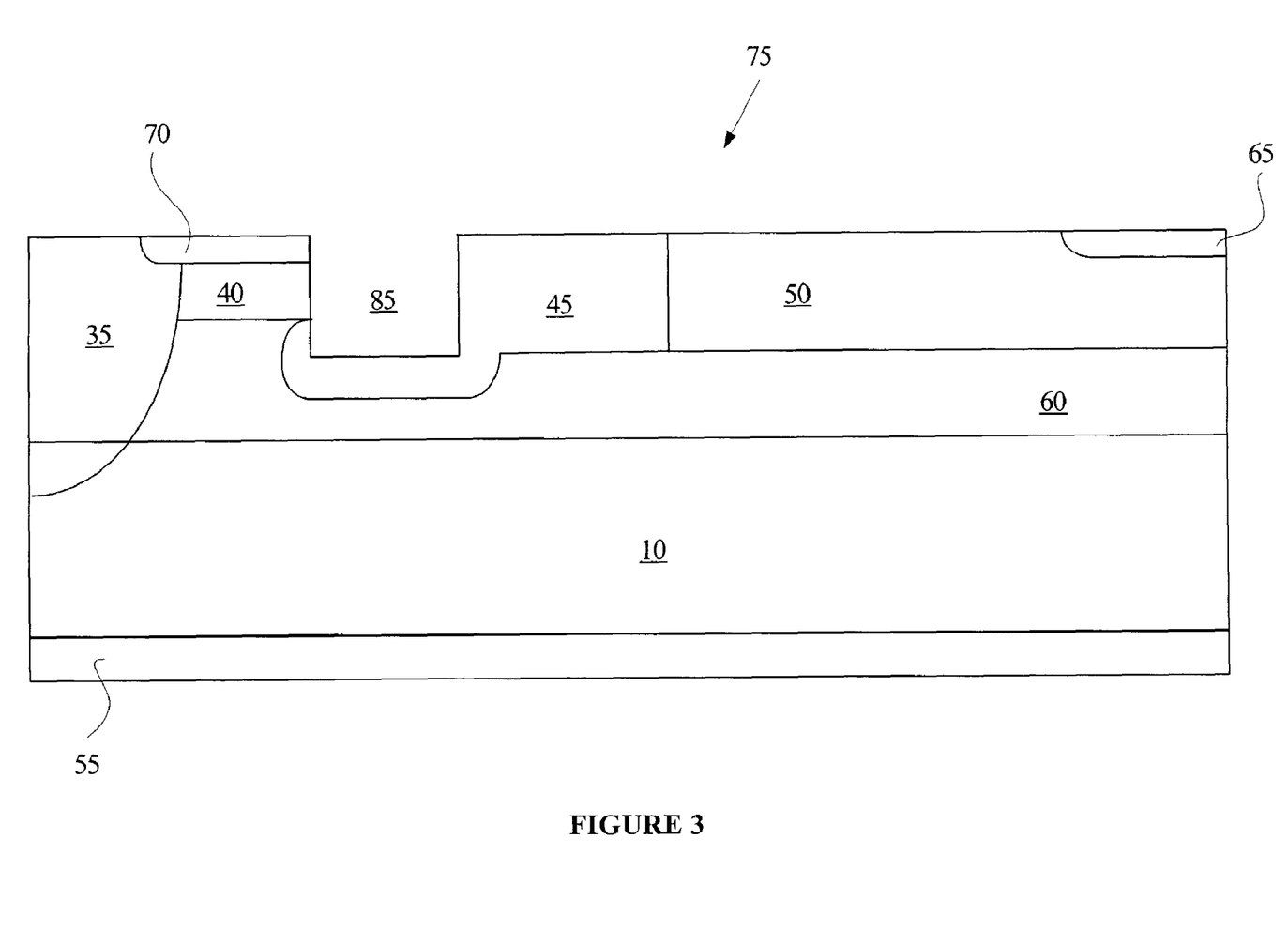
FIGS. 3–5 illustrate various configurations of the MOSFET device during its manufacture in one aspect of the invention.

Referring to FIG. 3, the process begins with substrate 10. Any substrate known in the art can be used in the invention. Suitable substrates include silicon wafers, epitaxial Si layers, polysilicon layers, bonded wafers such as used in silicon-on-insulator (SOI) technologies, and/or amorphous silicon layers, all of which may be doped or undoped. If the substrate is undoped, it can then be doped with a first conductivity type dopant to the concentration noted above by any method known in the art.

Next, the backside contact region 55 is formed. In one aspect of the invention, the contact region 55 can be formed by a metallization process. Then, if the epitaxial layer 60 is not already present, it is formed on the substrate 10 by any process known in the art. If the epitaxial layer is not doped in situ, then the desired doping concentration can be formed using any known process. Next, the various dopant regions 35, 40, 45, 50, 65, and 70 can be formed as known in the art.

As depicted in FIG. 3, trench 85 is then formed in the upper surface of the epitaxial layer 60. The trench 85 can be formed by any suitable masking and etching process known in the art. For example, the etching process can begin by forming a mask (not shown) with an opening(s) where the trench(es) will be formed. The silicon in the trench is then removed by etching through the mask. The parameters of the etching process are controlled to preferably form round bottom corners, smooth and continuous sidewalls, flat and clean trench bottom surfaces, and trench depth, thereby maintaining the integrity of the device characteristics using the trenches. After forming the trenches, the mask is removed by any suitable process known in the art.

As depicted in FIG. 4, the trench 85 is then filled with the material for insulating layer 80. This material for the insulating layer can be any high-quality insulating material known in the art, such as silicon nitride, silicon oxide, or silicon oxynitride. In one aspect of the invention, the insulating layer is silicon oxide (or "oxide"). In this aspect of the invention, an oxide layer is provided on the top surface of the epitaxial layer 60, including the trench 85. Any suitable method known in the art—including oxidation and deposition—yielding a high quality oxide layer can be used to provide this oxide layer. The portions of the oxide layer on the surface of the epitaxial layer 60 are then removed by any known process, leaving the oxide solely within the trench 85.

Next, a second trench 105 is formed within the insulating layer 80. This second trench can be formed in a manner substantially similar to the method used to form the first trench 85, with a few modifications. The first modification is that the mask material and the etching chemical may be different to account for the difference between etching silicon and etching the material for the insulating layer 80, e.g., oxide. The second modification is that the width of the mask openings for the second trench 105 will be smaller than the first trench 85.

After the second trench 105 is formed, the conductive material 110 for the gate, source, and drain is deposited to fill and overflow the remaining portions of the second trench 105 as illustrated in FIG. 5. The conductive layer can be suitable material that can be used as a gate conductor, such as a metal, metal alloy, or polysilicon. In one aspect of the invention, the conductive layer is heavily doped polysilicon. The conductive layer can be deposited using any known deposition process, including chemical vapor deposition process. Optionally, the conductive layer 110 can be doped with any suitable dopant to the desired concentration, particularly when the conductive layer is polysilicon or when a silicide can be used to red e the resistance of the gate. Excess (and unneeded) portions of the conductive layer 110 are then removed using any conventional process to form the gate conductor 30, the source electrode 15, and the drain electrode 20. In another aspect of the invention, additional deposition, masking, and etching steps can be used if the conductive material for the gate conductor, the source electrode, and the drain electrode will be different.

After the above processes are concluded, conventional processing can continue to finish the MOSFET device. As well, other processing needed to complete other parts of the semiconductor device can then be carried out, as known in the art.

In the aspect of the invention described above and illustrated in the Figures, the first conductivity type is a p-type dopant and the second conductivity type is an n-type dopant. In another aspect of the invention, the device can be configured with the first conductivity type being a n-type dopant and the second conductivity type dopant being a p-type dopant.

Figure 6:
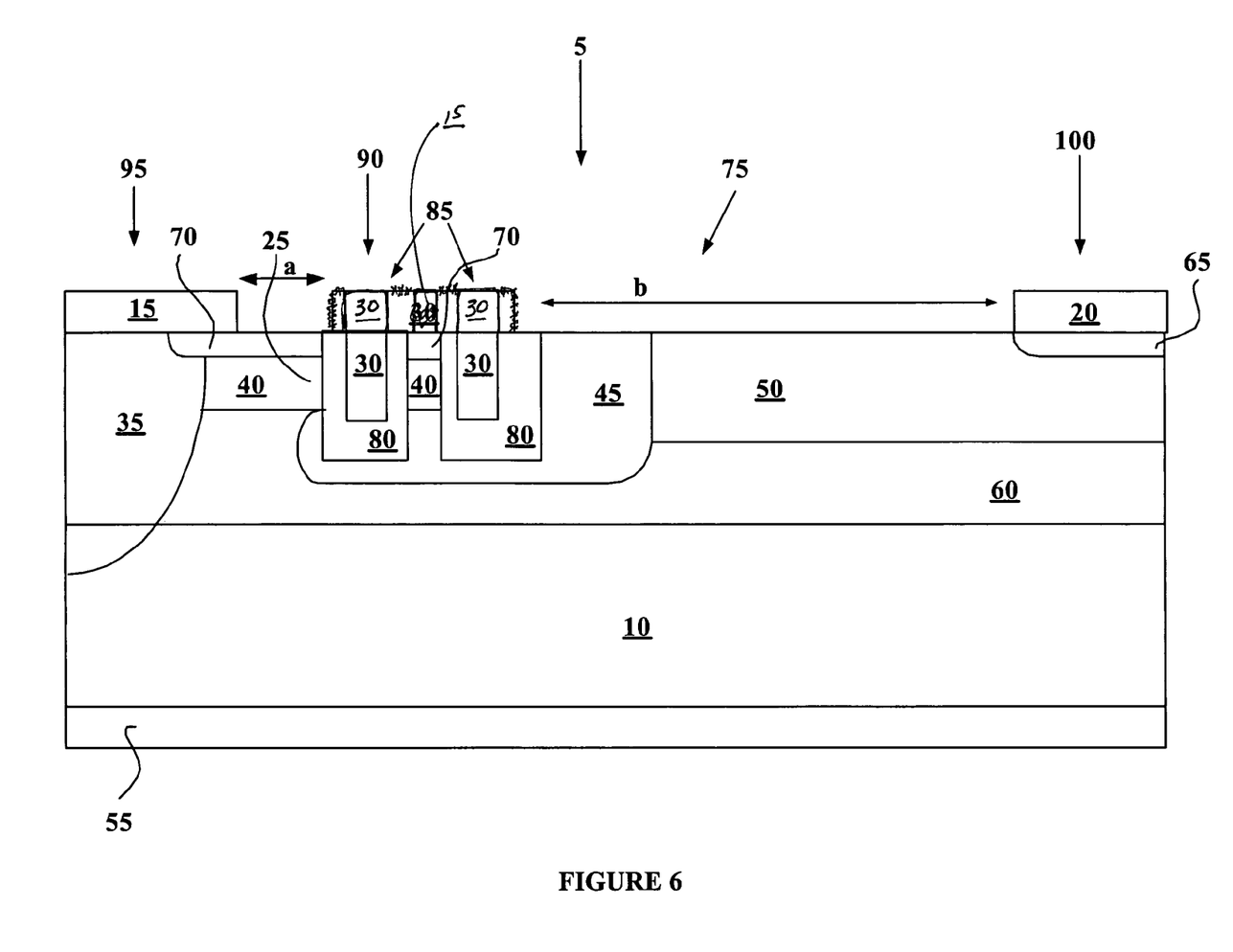
FIG. 6 illustrates a MOSFET device in another aspect of the invention.

The devices of the invention can also be modified to contain more than a single gate. For example, as depicted in FIG. 6, the devices of the invention can contain two trench gates between the source and drain. In the aspect of the invention shown in FIG. 6, the device can contain one gate with a symmetric oxide and one gate with an asymmetric oxide. In another aspect of the invention, both gates can contain an asymmetric oxide. The device in FIG. 6 is manufactured similar to the device depicted in FIG. 2, except that two trenches with two gate structures could be provided instead of a single trench.

Having described these aspects of the invention, it is understood that the invention defined by the appended claims is not to be limited by particular details set forth in the above description, as many apparent variations thereof are possible without departing from the spirit or scope thereof.

We claim:

1. A method for making a MOSFET, comprising:
   providing a substrate including an epitaxial layer;
   forming a first trench in the epitaxial layer;
   filling the first trench with an insulating layer;
   forming a second trench in the insulating layer such that the second trench is not symmetric relative to the first trench;
   filling the second trench with a conductive material; and
   forming a plurality of dopant regions adjacent the first trench with a first one of the plurality of dopant regions extending under the first trench.

2. The method of claim 1 further comprising forming the plurality of dopant regions within the epitaxial layer.

3. The method of claim 2 wherein a second one of the plurality of dopant regions is formed adjacent the first one of the plurality of dopant regions, the second one of the plurality of dopant regions having a higher dopant concentration than the first one of the plurality of dopant regions.

4. The method of claim 3 wherein the substrate and the epitaxial layer are of a first conductivity type, and the first one of the plurality of dopant regions and the second one of the plurality of dopant regions are of a second conductivity type.

5. A method for making a MOSFET, comprising:
   providing a substrate having an epitaxial layer thereon;
   forming a first trench in the epitaxial layer;
   filling the first trench with an oxide layer;
   forming a second trench in the oxide layer so that the second trench is not symmetric relative to the first trench;
   filling the second trench with a conductive material; and
   forming a plurality of dopant regions adjacent the first trench and within the epitaxial layer, wherein the plurality of dopant regions contains a first dopant region extending under the first trench and a second dopant region with a dopant concentration higher than the first dopant region.

6. The method of claim 5 wherein the substrate and the epitaxial layer are of a first conductivity type and the first and second dopant regions are of a second conductivity type.

7. A method of forming a MOSFET, comprising:
   forming a first trench in a silicon region extending over a substrate, the silicon region and the substrate being of a first conductivity type but having different doping concentrations;
   filling the first trench with an insulating layer;
   forming a second trench in the insulating layer, the second trench being asymmetrical relative to the first trench such that a spacing between a first sidewall of the first trench and a corresponding first sidewall of the second trench is different than a spacing between a second sidewall of the first trench and a corresponding second sidewall of the second trench;
   forming a conductive material in the second trench; and
   forming a first drift region of a second conductivity type in the silicon region, the first drift region extending under the first trench.

8. The method of claim 7 further comprising:
   forming second and third drift regions of the second conductivity type in the silicon region, the second drift region separating the third drift region from the first trench.

9. The method of claim 8 wherein the first, second, and third drift regions are contiguous, the second drift region having a higher doping concentration than the first drift region, and the third drift region having a higher doping concentration than the second drift region.

10. The method of claim 7 wherein the remaining portion of the insulating layer after forming the second trench is thicker along a bottom of the first trench than along one of the sidewalls of the first trench.

11. The method of claim 7 wherein the remaining portion of the insulating layer after forming the second trench is thicker along a first sidewall of the first trench than along a second sidewall of the first trench opposing the first sidewall.

12. The method of claim 7 wherein the silicon region is an epitaxial layer, the method further comprising:
   forming the epitaxial layer over the substrate.

13. A MOSFET comprising:
   a first silicon region of a first conductivity type;
   a gate trench extending into the first silicon region, the gate trench having an asymmetric insulating layer along two of its opposing sidewalls;
   a source region having a dopant region of a second conductivity type, the dopant region laterally extending along one side of the gate trench to contact a source electrode; and
   a lightly doped drain region of the second conductivity type laterally extending below and along an opposing side of said one side of the gate trench to contact a drain electrode, wherein a spacing between the drain electrode and the gate trench is greater than a corresponding spacing between the source electrode and the gate trench.

14. The MOSFET of claim 13 wherein the lightly doped drain region partially extends up along a first sidewall of the gate trench such that a channel region along the first sidewall between the source region and the lightly doped drain region extends along only the vertical dimension.

15. The MOSFET of claim 13 wherein the lightly doped drain region comprises at least first and second drift regions, the second drift region being laterally separated from the gate trench at least by the first drift region, the first drift region having a lower doping concentration than the second drift region.

16. The MOSFET of claim 13 wherein the asymmetric insulating layer extends along a bottom of the trench, the asymmetric insulating layer being thicker along the bottom of the gate trench than along the sidewall of the gate trench adjacent the source region.

17. The MOSFET of claim 13 wherein the asymmetric insulating layer is thicker along the sidewall of the gate trench adjacent the lightly doped drain region than along the sidewall of the gate trench adjacent the source region.

18. The MOSFET of claim 13 being configured such that in the on state a conduction channel is formed along the sidewall of the gate trench adjacent the source region while no conduction channel is formed along the sidewall of the gate trench adjacent the lightly doped drain region.

19. The MOSFET of claim 13 wherein the first silicon region is an epitaxial layer over a substrate, the dopant region in the source region and the epitaxial layer being electrically connected together so as to be biased to the same potential.

20. The MOSFET of claim 13 wherein the MOSFET is a radio frequency MOSFET.

21. A MOSFET comprising:
a first silicon region of a first conductivity type;
a gate trench extending into the first silicon region, the gate trench having an asymmetric insulating layer along two of its opposing sidewalls;
a source region having a dopant region of a second conductivity type, the dopant region laterally extending along one side of the gate trench to contact a source electrode; and
a lightly doped drain region of the second conductivity type laterally extending below and along an opposing side of said one side of the gate trench to contact a drain electrode, the lightly doped drain region comprising at least first and second drift regions, the second drift region being laterally separated from the gate trench at least by the first drift region, the first drift region having a lower doping concentration than the second drift region.

22. The MOSFET of claim 21 wherein the lightly doped drain region partially extends up along a first sidewall of the gate trench such that a channel region along the first sidewall between the source region and the lightly doped drain region extends only along the vertical dimension.

23. The MOSFET of claim 21 wherein a spacing between the drain electrode and the gate trench is greater than a corresponding spacing between the source electrode and the gate trench.

24. The MOSFET of claim 21 wherein the asymmetric insulating layer extends along a bottom of the gate trench, the asymmetric insulating layer being thicker along the bottom of the gate trench than along the sidewall of the gate trench adjacent the source region.

25. The MOSFET of claim 21 wherein the asymmetric insulating layer is thicker along the sidewall of the gate trench adjacent the lightly doped drain region than along the sidewall of the gate trench adjacent the source region.

26. The MOSFET of claim 21 being configured such that in the on state a conduction channel is formed along the sidewall of the gate trench adjacent the source region while no conduction channel is formed along the sidewall of the gate trench adjacent the lightly doped drain region.

27. The MOSFET of claim 21 wherein the first silicon region is an epitaxial layer over a substrate, the dopant region in the source region and the epitaxial layer being electrically connected together so as to be biased to the same potential.

28. A MOSFET comprising:
an epitaxial layer of a first conductivity type over a substrate;
a gate trench extending into the epitaxial layer, the gate trench having an asymmetric insulating layer along two of its opposing sidewalls;
a source region having a dopant region of a second conductivity type in the epitaxial layer, the dopant region laterally extending along one side of the gate trench to contact a source electrode; and
a lightly doped drain region of the second conductivity type laterally extending below and along an opposing side of said one side of the gate trench to contact a drain electrode, the lightly doped drain region comprising at least first and second drift regions, the second drift region being laterally separated from the gate trench at least by the first drift region, the first drift region having a lower doping concentration than the second drift region,
wherein a spacing between the drain electrode and the gate trench is greater than a corresponding spacing between the source electrode and the gate trench.

29. The MOSFET of claim 28 wherein the asymmetric insulating layer extends along a bottom of the trench, the asymmetric insulating layer being thicker along the bottom of the gate trench than along the sidewall of the gate trench adjacent the source region.

30. The MOSFET of claim 28 wherein the asymmetric insulating layer is thicker along the sidewall of the gate trench adjacent the lightly doped drain region than along the sidewall of the gate trench adjacent the source region.

31. The MOSFET of claim 28 being configured such that in the on state a conduction channel is formed along the sidewall of the gate trench adjacent the source region while no conduction channel is formed along the sidewall of the gate trench adjacent the lightly doped drain region or along a bottom of the gate trench.

32. A MOSFET comprising:
a first silicon region of a first conductivity type;
first and second gate trenches extending into the first silicon region, the first gate trench having an asymmetric insulating layer along two of its opposing sidewalls, the second gate trench having a symmetric insulating layer along two of its opposing sidewalls;
a plurality of dopant regions in the first silicon region, a first one of the plurality of dopant regions having a second conductivity type and laterally extending along one side of the second gate trench to contact a source electrode, and a second one of the plurality of dopant regions of the second conductivity type separating the first and second gate trenches; and
a lightly doped drain region of the second conductivity type laterally extending along one side of the first gate trench to contact a drain electrode, the lightly doped drain region further extending below both the first and second gate trenches.

33. The MOSFET of claim 32 wherein the lightly doped drain region comprises at least first and second drift regions, the second drift region being laterally separated from the first gate trench at least by the first drift region, the first drift region having a lower doping concentration than the second drift region.

34. The MOSFET of claim 32 wherein the lightly doped drain region partially extends up along a first sidewall of the second gate trench such that a channel region along the first sidewall between the first one of the plurality of dopant regions and the lightly doped drain region extends only along the vertical dimension.

35. The MOSFET of claim 32 wherein a spacing between the drain electrode and the first gate trench is greater than a spacing between the source electrode and the second gate trench.

36. The MOSFET of claim 32 wherein:
the symmetric insulating layer extends along a bottom of the second gate trench, the symmetric insulating layer being thicker along the bottom of the second gate trench than along the sidewalls of the second gate trench, and the asymmetric insulating layer extends along a bottom of the first gate trench, the asymmetric insulating layer being thicker along the bottom of the first gate trench than along a sidewall of the first gate trench adjacent the second one of the plurality of dopant regions.

37. The MOSFET of claim 32 wherein the asymmetric insulating layer is thicker along a sidewall of the first gate trench adjacent the lightly doped drain region than along a sidewall of the first gate trench adjacent the second one of the plurality of dopant regions.

38. The MOSFET of claim 32 being configured such that in the on state a conduction channel is formed along those sidewalls of the first and second gate trenches adjacent the first one and second one of the plurality of dopant regions while no conduction channel is formed along a sidewall of the first gate trench adjacent the lightly doped drain region.

39. The MOSFET of claim 32 wherein the first silicon region is an epitaxial layer over a substrate.

* * * * *

UNITED STATES PATENT AND TRADEMARK OFFICE
CERTIFICATE OF CORRECTION

| | | |
|---|---|---|
| PATENT NO. | : 7,033,891 B2 | Page 1 of 1 |
| APPLICATION NO. | : 10/269126 | |
| DATED | : April 25, 2006 | |
| INVENTOR(S) | : Wilson et al. | |

It is certified that error appears in the above-identified patent and that said Letters Patent is hereby corrected as shown below:

In the Claims

Column 8, line 42, in Claim 10, delete "the remaining portion" and insert --a remaining portion-- therefore.

Column 8, line 46, in Claim 11, delete "the remaining portion" and insert --a remaining portion-- therefore.

Column 9, line 8, in Claim 14, delete "the" and insert --a-- therefore.

Column 9, line 25, in Claim 18, delete "the on state" and insert --an on state-- therefore.

Column 9, line 32, in Claim 19, delete "the same" and insert --a same-- therefore.

Column 9, line 58, in Claim 22, delete "the" and insert --a-- therefore.

Column 10, line 6, in Claim 26, delete "the on state" and insert --an on state-- therefore.

Column 10, line 13, in Claim 27, delete "the same" and insert --a same-- therefore.

Column 10, line 47, in Claim 31, delete "the on state" and insert --an on state-- therefore.

Column 11, line 15, in Claim 35, delete "the" and insert --a-- therefore.

Column 12, line 14, in Claim 38, delete "the on state" and insert --an on state-- therefore.

Column 12, line 14, in Claim 38, delete "those".

Signed and Sealed this
Eighteenth Day of February, 2014

Michelle K. Lee
*Deputy Director of the United States Patent and Trademark Office*